May 23, 1967 M. B. BLOCH 3,321,715

CRYSTAL OSCILLATOR CIRCUIT USING
FEEDBACK CONTROL TECHNIQUES
Filed Sept. 25, 1964

INVENTOR
MARTIN B. BLOCH

BY Claude Funkhouser
ATTORNEY

United States Patent Office 3,321,715
Patented May 23, 1967

3,321,715

CRYSTAL OSCILLATOR CIRCUIT USING FEEDBACK CONTROL TECHNIQUES

Martin B. Bloch, Forest Hills, N.Y., assignor, by mesne assignments, to the United States of America as represented by the Secretary of the Navy
Filed Sept. 25, 1964, Ser. No. 399,411
1 Claim. (Cl. 331—109)

The present invention relates generally to oscillator circuits and more specifically to crystal controlled oscillator circuits.

An object of the present invention is the provision of a highly accurate high frequency oscillator.

Yet another object of the present invention is to provide an oscillator circuit with a constant frequency output capable of automatic synchronization.

Still another object is the provision of an automatically synchronized oscillator having virtual freedom from drift.

A further object is the provision of a highly accurate oscillator capable of synchronization by digital signals.

Other objects and features of the invention will become apparent by reference to the following detailed description of an embodiment of the invention in conjunction with the accompanying drawings, in which like reference numerals designate like parts through the figures thereof and wherein.

Figures 1, 2:
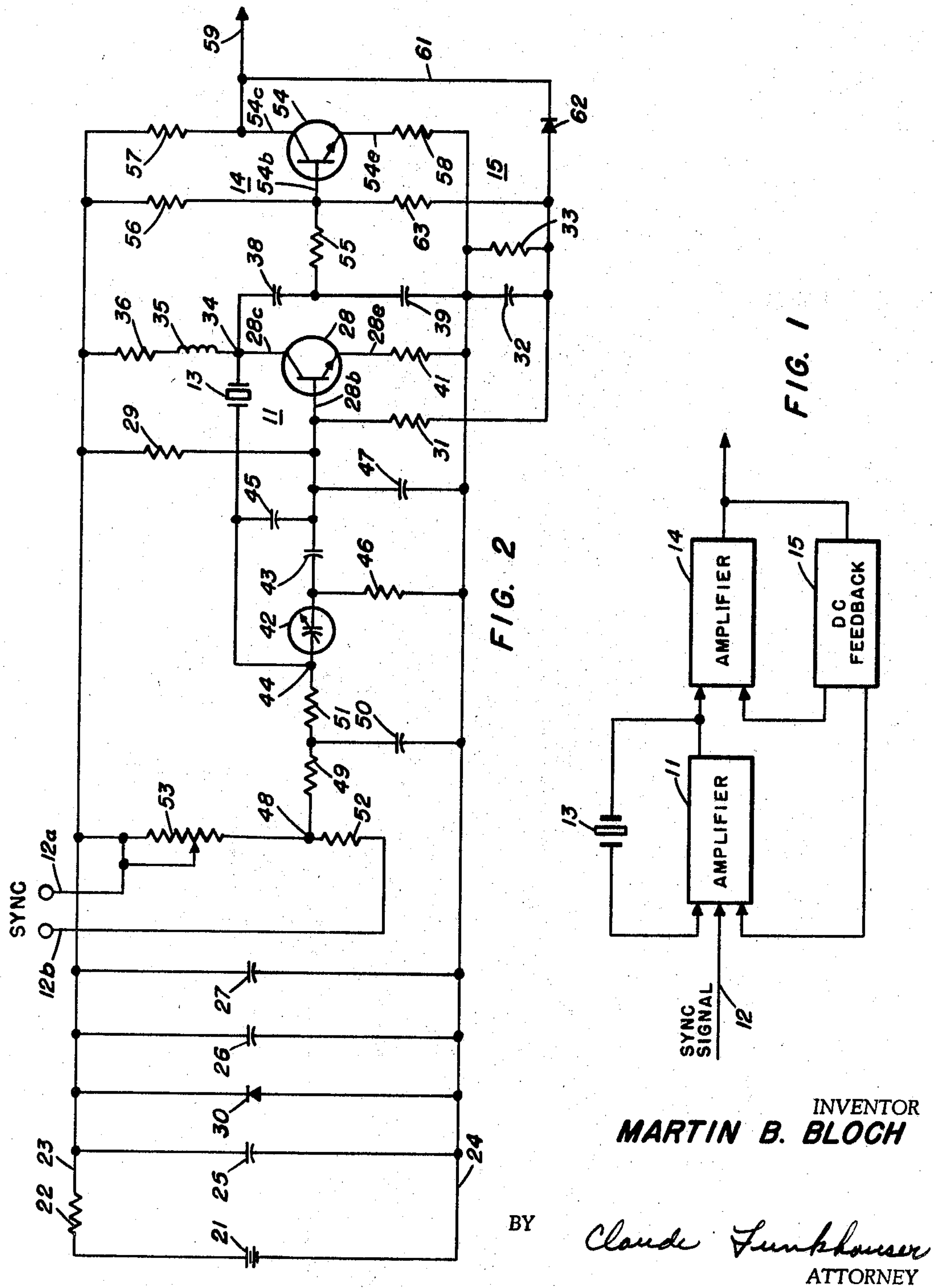
FIG. 1 shows a functional block diagram of the invention.
FIG. 2 illustrates a detailed schematic circuit diagram of the device.

Referring now to the drawings, there is shown in FIG. 1 a first amplifier means or stage 11, having an external input lead 12, the output of amplifier 11 is connected to one terminal of a quartz cut crystal 13, the other terminal of which is connected to another input to the amplifier stage 11. The output of amplifier 11 is also applied as an input to a second amplifier means or stage 14, the output of which second amplifier serves as the output of the oscillator and is also applied to a D.C. feedback means or network 15. The signal from the D.C. feedback means is fed back to amplifiers 11 and 14.

In operation, the frequency determining device of the oscillator is the crystal 13, control for which is provided by a synchronization signal (hereinafter referred to as sync signal) received on lead 12 and the first amplifier means 11.

The D.C. feedback loop 15 controls the voltage output of amplifier stage 11 by limiting its gain. This circuit allows the oscillator to have a very fast starting time because, when the circuit is turned on, the feedback loop will not be limiting the output from amplifier means 11. With no D.C. feedback, the crystal 13 will have a high current, and amplifier stage 11 will have a large voltage output. However, this large voltage output cannot be sustained, because the feedback network 15 will begin to bias amplifier 11 so as to reduce its gain. This reduction in gain will continue until the over-all gain of the oscillator is equal to 1, the necessary closed loop gain for steady state operation. Thus, the D.C. feedback loop is the major controller of amplifier 11 output and the closed loop gain.

When the gain of the oscillator is reduced to 1, the D.C. feedback network 15 will be the controlling element. The feedback loop 15 can now be adjusted to control the level of oscillation and thus, keep the crystal current at a low level during steady-state conditions. D.C. feedback is also used to regulate the bias of the second amplifier means 14 for added stability of operation.

Pulses on lead 12 from external equipment will enable the oscillator to maintain synchronization with other equipment by changing parameters which form part of amplifier stage 11 and are in series with the crystal 13.

Turning now to FIG. 2, a detailed schematic diagram, there is shown a source of D.C. voltage 21 having a resistor 22 in series with a lead or bus 23 from the positive side and a lead or bus 24 from the negative side of the source 21. A combination of a Zener diode 30 and capacitors 25 to 27 are in parallel connection between leads 23 and 24.

A first NPN transistor 28, forming a portion of amplifier stage 11, having base, collector and emitter leads extending therefrom, **28*b*, 28*e* and 28*c*, is connected between the leads 23 and 24 in common emitter configuration. The base lead 28*b* is conected to the positive bus 23 via a resistor 29 and to the negative bus 24 via the combination of a resistor 31 in series with the parallel combination of a capacitor 32 and a resistor 33. The capacitor 32 and resistor 33 form a portion of the D.C. feedback network 15 as shown in FIG. 1. The collector lead 28*c* is connected to the positive bus 23 via a terminal point 34, an inductor coil 35 and a resistor 36 in series, and is connected to the negative bus 24 via terminal point 34 and capacitors 38 and 39 in series circuit relationship. The emitter lead 28*e* is tied to the negative bus 24 through a resistor 41. Between the emitter lead 28*e*, junction 34 and the base terminal 28*b* is a series loop of the precision cut crystal 13, a variable capacitor or Varicap 42, and a capacitor 43. Also tied between the connection of the crystal 13 and the Varicap 42 at the common junction 44, and the base terminal 28*b* is a parallel capacitor 45. Between the junction of Varicap 42 and capacitor 43, and the negative bus 24 a biasing resistor 46 is connected, and between the junction of capacitor 43 and base terminal 28*b*, and the negative bus 24 is a capacitor 47. The sync lead 12*a* is connected to the junction point 44 via a terminal point 48 and series resistors 49 and 51, and the sync lead 12*b* is tied to the junction point 48 via the resistor 52, a fixed end of which resistor is tied to junction point 48. Between resistors 49 and 51, a capacitor 50 is tied to bus 24. The terminal point 48 is tied to the positive bus 23 through a variable resistor 53**.

Tied to the junction of capacitors 38 and 39 is the base lead **54*b* of an NPN transistor 54, via a coupling resistor 55. This transistor is also connected in the common emitter configuration and forms the second amplifier stage 14. Biasing of the base terminal 54*b* and collector terminal 54c is accomplished by connection to the postive bus 23 via resistors 56 and 57, respectively. The emitter terminal 54*e* is biased by resistor 58 connected to the negative bus 24**.

The output of the oscillator is taken from the collector terminal **54*c* over lead 59, and is also fed back over lead 61 through a diode rectifier 62 and resistor 63 to the base terminal 54*b*. D.C. feedback to transistor 28 is accomplished from lead 61, diode 62 and resistor 31**.

The D.C. source 21, which is regulated by the network consisting of series resistor 22 and the parallel combination of Zener diode 30 and capacitors 25 to 27, provides biasing voltages for the oscillator. The oscillator generates a fixed high frequency sine wave which is determined by the characteristics of the quartz crystal 13 and the effective lumped capacitance of capacitors 42, 43 and 45 in series therewith. The voltage across the Varicap 42 is determined by the values of the resistors 53, 49, 51 and 46 and the voltage thereacross which biases the Varicap. The Varicap's impedance varies in accordance with the voltage appearing thereacross. Therefore, as the bias across the Varicap changes, the effective capacitance of the network of capacitors 42, 43 and 45 varies to change the oscillating frequency of the crystal. The oscillator action may be likened to that of a conventional transistor oscillator with the collector base tuned circuit replaced by the crystal and capacitance. This replacement offers greater temperature stability and a high degree of accuracy.

With no sync signal appearing on leads 12*a* and 12*b*, the voltage at junction 48 is determined by the value of resistance, and the oscillator output may be adjusted by adjusting the wiper arm of resistor 53 to provide the proper bias to the Varicap 46. To tune the crystal to its nominal frequency, the parallel combination of capacitors 43 and 45 is utilized. The tank circuit of resistor 36, coil 35 and capacitors 38 and 39 function to maintain the oscillator insensitive to spurious outputs from the crystal.

The base biasing resistors 29, 31 and 33 bias transistor 28 near cutoff value and make the biasing compatible with the D.C. feedback network 15 which includes the resistor 33. Emitter biasing of transistor 28 is provided by resistor 41 which establishes a high loop gain to insure fast starting action. The output of amplifier means 11 is taken from point 34 and coupled to the base of transistor 54 via coupling capacitor and resistors 38 and 55, respectively. The signal is amplified thereby and the output appears on lead 59. The emitter biasing resistor 58 and the collector load resistor 57 are picked to provide the necessary gain for feedback and compatibility with the following circuitry.

D.C. feedback to transistors 28 and 54 is provided by the path through diode 62 and either of resistors 31 and 63, limiting the gain of transistors 28 and 54 to provide an all-over gain of unity thereby stabilizing the device.

By sampling a portion of the output signal and comparing it with a signal with which the oscillator is synchronized and producing a sync signal, which, for example, may be a pulsed D.C., capacitor 50 will be charged through the integrator action of the combination of capacitor 50 and resistor 49. The charge on the capacitor will discharge through resistor 51 and influence the bias on Varicap 42, thus changing the frequency of oscillation of the device dependent upon the magnitude and sense of the sync signal.

Thus, a novel oscillator circuit has been fully disclosed which circuit provides a highly accurate constant frequency output capable of automatic synchronization by the application of synchronization signals thereto.

Various modifications are contemplated and may obviously be resorted to by those skilled in the art without departing from the spirit and scope of the invention, as hereinafter defined by the appended claim, as only an embodiment thereof has been disclosed.

I claim:

An oscillator circuit comprising:

a first and a second transistor stage each having a base, an emitter and a collector terminal, said stages cascaded in common emitter configuration with the collector of the first transistor connected to the base of the second transistor;

a plurality of capacitors connected in series-parallel relationship at one end to the base terminal of said first transistor, at least one of said plurality being a Varicap;

a quartz crystal connected between the collector terminal of said first transistor and the other end of said plurality of capacitors;

a D.C. feedback circuit connected to said collector terminal of said second transistor and the base terminals of said first and second transistors; and means for applying a bias signal capable of being variable to said Varicap.

References Cited by the Examiner

UNITED STATES PATENTS

| | | | |
|---|---|---|---|
| 2,093,565 | 9/1937 | Koch | 331—183 X |
| 2,912,654 | 11/1959 | Hansen | 331—117 |
| 2,936,428 | 5/1960 | Schweitzer | 331—36 X |
| 3,108,223 | 10/1963 | Hunter | 331—116 X |
| 3,200,349 | 8/1965 | Bangert | 331—116 |

OTHER REFERENCES

The Bell System Technical Journal, March 1963, pages 324–325.

ROY LAKE, *Primary Examiner.*

J. B. MULLINS, *Assistant Examiner.*